United States Patent
Guerra et al.

(10) Patent No.: US 9,438,112 B2
(45) Date of Patent: Sep. 6, 2016

(54) POWER CONVERTER INCLUDING INTEGRATED DRIVER FOR DEPLETION MODE GROUP III-V TRANSISTOR

(71) Applicant: Infineon Technologies Americas Corp., El Segundo, CA (US)

(72) Inventors: Alberto Guerra, Palos Verdes Estates, CA (US); Ahmed Masood, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 636 days.

(21) Appl. No.: 13/949,155

(22) Filed: Jul. 23, 2013

(65) Prior Publication Data

US 2014/0055109 A1    Feb. 27, 2014

Related U.S. Application Data

(60) Provisional application No. 61/692,340, filed on Aug. 23, 2012.

(51) Int. Cl.
| | |
|---|---|
| *H01L 29/78* | (2006.01) |
| *H02M 3/158* | (2006.01) |
| *H02M 7/538* | (2007.01) |
| *H03K 17/08* | (2006.01) |
| *H02M 3/155* | (2006.01) |

(52) U.S. Cl.
CPC ............. *H02M 3/158* (2013.01); *H02M 7/538* (2013.01); *H03K 17/08* (2013.01)

(58) Field of Classification Search
CPC ... H01L 21/04; H01L 27/085; H01L 27/088; H01L 29/00; H01L 29/78; H01L 27/7838; H02M 3/145; H02M 3/155

USPC .......... 257/78, 392, 614, 615; 323/223, 225, 323/271, 282

See application file for complete search history.

(56) References Cited

U.S. PATENT DOCUMENTS

| | | | | |
|---|---|---|---|---|
| 7,439,805 | B1 * | 10/2008 | Kobayashi | H01L 28/10 257/E21.022 |
| 7,719,055 | B1 * | 5/2010 | McNutt | H01L 29/0843 257/280 |
| 8,816,497 | B2 * | 8/2014 | Wu | H02M 7/003 257/499 |
| 2008/0230784 | A1 * | 9/2008 | Murphy | H01L 27/0605 257/76 |
| 2009/0180304 | A1 | 7/2009 | Bahramian | |
| 2012/0105131 | A1 * | 5/2012 | Biela | H03K 17/687 327/430 |
| 2013/0062671 | A1 * | 3/2013 | Saito | H01L 29/7783 257/288 |

* cited by examiner

*Primary Examiner* — Gary L Laxton
(74) *Attorney, Agent, or Firm* — Murphy, Bilak & Homiller, PLLC

(57) ABSTRACT

In one implementation, a power converter includes an output stage integrated circuit (IC) on a group III-V die, and a driver IC for driving the output stage IC, the driver IC fabricated on a group IV die. The power converter also includes a composite power switch split between the group III-V die and the group IV die, wherein a depletion mode group III-V transistor of the composite power switch is monolithically integrated in the group III-V die, and a group IV control switch of the composite power switch is monolithically integrated in the group IV die. As a result, the depletion mode group III-V transistor may be operated as an enhancement mode transistor.

20 Claims, 4 Drawing Sheets

POWER CONVERTER INCLUDING INTEGRATED DRIVER FOR DEPLETION MODE GROUP III-V TRANSISTOR

The present application claims the benefit of and priority to a pending provisional application entitled "Integrated Driver for Group III-V Depletion Mode Power Switch," Ser. No. 61/692,340 filed on Aug. 23, 2012. The disclosure in this pending provisional application is hereby incorporated fully by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

It is noted that, as used herein, the terms "low voltage" or "LV" in reference to a transistor or switch corresponds describes a transistor or switch with a voltage range of up to approximately fifty volts (50V). It is further noted that use of the term "midvoltage" or "MV" refers to a voltage range from approximately fifty volts to approximately two hundred volts (approximately 50V-200V). Moreover, the term "high voltage" or "HV", as used herein, refers to a voltage range from approximately two hundred volts to approximately twelve hundred volts (approximately 200V-1200V), or higher.

II. Background Art

Group III-V high electron mobility transistors (HEMTs), such as III-Nitride HEMTs, typically operate using piezoelectric polarization fields to generate a two-dimensional electron gas (2DEG) that allows for high current densities with low resistive losses. As a result, switching power converters utilizing group III-V HEMTs can advantageously offer high efficiency. The 2DEG can arise naturally at a heterojunction interface of the HEMT and, as a result, conventional group III-V HEMTs tend to be implemented as depletion mode (i.e., normally ON) transistors, which can be a disadvantage when such depletion mode transistors are used as power switches. For example, in power applications it is usually desirable to avoid conducting current through the group III-V HEMTs before control circuitry is fully powered and operational.

Thus, in power management applications in which enhancement mode (i.e., normally OFF) characteristics of power switches are desirable, a depletion mode group III-V transistor can be cascoded with a low voltage (LV) switch to produce an enhancement mode composite power switch. However, conventional approaches for enabling enhancement mode functionality by a composite power switch typically require a hybrid assembly including separate dies for fabrication of the respective LV switches and the group III-V HEMTs. In addition, such hybrid assemblies may preclude monolithic integration of multiple group III-V HEMTs on a single semiconductor die.

SUMMARY

The present disclosure is directed to a power converter including an integrated driver for one or more depletion mode group III-V transistors, substantially as shown in and/or described in connection with at least one of the figures, and as set forth more completely in the claims.

DETAILED DESCRIPTION

Figure 1:
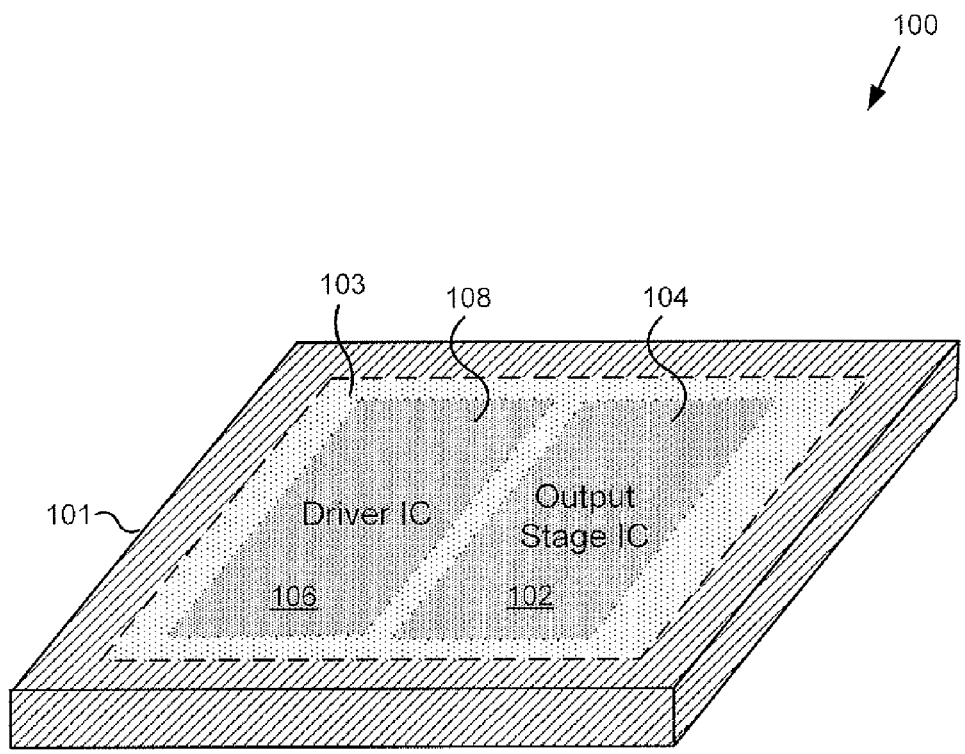
FIG. 1 shows a perspective view of a package containing a power converter including a driver integrated circuit (IC) and an output stage IC having one or more depletion mode group III-V transistors, according to one exemplary implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Group III-V field-effect transistors (FETs), such as high electron mobility transistors (HEMTs) utilizing III-Nitride semiconductor materials, typically operate using piezoelectric polarization fields to generate a two-dimensional electron gas (2DEG) allowing for high current densities with low resistive losses. Because the 2DEG can arise naturally at a heterojunction interface of the III-Nitride or other group III-V materials forming the HEMT, conventional group III-V HEMTS typically conduct without the application of a gate potential. That is to say, conventional III-Nitride and other group III-V HEMTs tend to be depletion mode (i.e., normally ON) devices.

Although their high breakdown voltage, high current density, and low ON resistance render group III-V HEMTs potentially advantageous for use in power applications, the normally ON nature of conventional group III-V HEMTs can give rise to problems when such depletion mode transistors are used as power switches. For example, and as noted above, in power applications it is typically desirable to avoid conducting current through the group III-V HEMTs before control circuitry is fully powered and operational.

Thus, in power management applications where enhancement mode (i.e., normally OFF) characteristics of power switches are desirable, a depletion mode III-Nitride or other group III-V transistor can be cascoded with a control switch, such as a silicon or other group IV control switch, to produce an enhancement mode composite power switch. However, and as further noted above, conventional approaches for enabling such enhancement mode functionality by a composite power switch typically require a hybrid assembly including separate dies for fabrication of each of the respective group IV control switch and the group III-V transistor. In addition, such hybrid assemblies substantially preclude monolithic integration of multiple group III-V transistors, such as low-side and high-side transistors of a power stage, on a single semiconductor die.

The present application discloses a power converter including an output stage integrated circuit (IC) on a group III-V die, and a driver IC fabricated on a group IV die and configured to drive the output stage IC. In one implementation, a composite power switch of such a power converter is split between the group III-V die, which includes a group III-V transistor monolithically integrated in the group III-V die, and a group IV die, which includes a group IV control switch monolithically integrated in the group IV die. The group IV control switch is cascoded with the depletion mode group III-V transistor so as to enable operation of the depletion mode group III-V transistor as an enhancement mode transistor. The group IV control switch may be a low voltage (LV) switch, and may be formed as a silicon or other group IV FET, such as a metal-oxide-semiconductor FET (MOSFET), fabricated as part of the driver IC. By monolithically integrating the group IV control switch into the driver IC, the present inventive concepts enable use of low voltage IC technology for fabrication of the group IV control switch, resulting in a very low $R_{DS\_ON}$ figure of merit for the group IV control switch output.

It is noted that in the interests of conceptual clarity, the present inventive principles will be described by reference to specific implementations including one or more gallium nitride (GaN) based depletion mode transistors. However, it is emphasized that such an implementation is merely exemplary, and the inventive principles disclosed herein are broadly applicable to a wide range of applications implemented using other III-Nitride material based, or other group III-V semiconductor based, depletion mode transistors for which enhancement mode functionality is desirable or required.

FIG. 1 shows a perspective view of a package containing a power converter including a driver IC and an output stage IC having one or more depletion mode group III-V transistors, according to one exemplary implementation. Power converter 100 includes output stage IC 102 on group III-V die 104, and driver stage IC 106 on group IV die 108. As shown in FIG. 1, group IV die 108 including driver IC 106 and group III-V die 104 including output stage IC 102 are enclosed in package 101, which is shown as a multi-chip module (MCM) configured to contain only two semiconductor dies. In addition, and as further shown by FIG. 1, package 101 may include optional heat spreader 103. It is noted that the perspective view shown by FIG. 1 is adapted in the interests of conceptual clarity so as to show output stage IC 102 and driver IC 106 as though seen through the enclosure provided by package 101, and as though seen through optional heat spreader 103, which may overlie output stage IC 102 and driver IC 106.

Group III-V die 104, also referred to herein as "output stage die 104", may be formed as a III-Nitride die, and may have one or more layers including gallium nitride (GaN), for example. Group IV die 108, also referred to herein as "driver IC die 108" may be implemented as a silicon die. Group IV or driver IC die 108 includes driver IC 106 for driving output stage IC 102 on group III-V or output stage die 104. Although not explicitly shown in FIG. 1, output stage IC 102 includes one or more depletion mode group III-V transistors monolithically integrated in group III-V or output stage die 104, and driver IC 106 includes a one or more corresponding group IV control switches monolithically integrated in group IV or driver IC die 108. As will be described more fully below, each group IV control switch is cascoded with a respective depletion mode group III-V transistor, resulting in the depletion mode group III-V transistor(s) being operated as respective one or more enhancement mode group III-V transistors.

Package 101 may be implemented utilizing a quad-flat no-leads (QFN) package design, for example. In such an implementation, output stage IC 102 and driver IC 106 may be flip chip mounted within package 101 so as to make electrical connection with one another through a package substrate or lead frame of package 101. Package 101 may be a lead frame package, or may be formed using a laminate technology, as known in the art. Inclusion of optional heat spreader 103 overlying output stage IC 102 and driver IC 106 can advantageously improve thermal dissipation and thereby enhance high power operation by power converter 100.

The exemplary implementation depicted in FIG. 1 includes several desirable features. For example, utilizing package 101 having a substantially no-leads package design advantageously reduces parasitic inductances and capacitances of power converter 100. In addition, utilizing only two discrete semiconductor dies to produce its desired functionality, package 101 further reduces parasitic inductances and capacitances, while concurrently enabling a substantial reduction in package size when compared to conventional implementations having a hybrid assembly as described above.

In some implementations, power converter 100 including output stage IC 102 and driver IC 106 may have a single composite power switch configured for use in a single-ended synchronous rectifier, for example. In other implementations, power converter 100 may include multiple depletion mode group III-V transistors in output stage IC 104, such as two depletion mode GaN or other III-Nitride transistors, for example. Consequently, power converter 100 may be advantageously utilized as a voltage converter, for example a buck converter, in a variety of applications.

Figure 2:
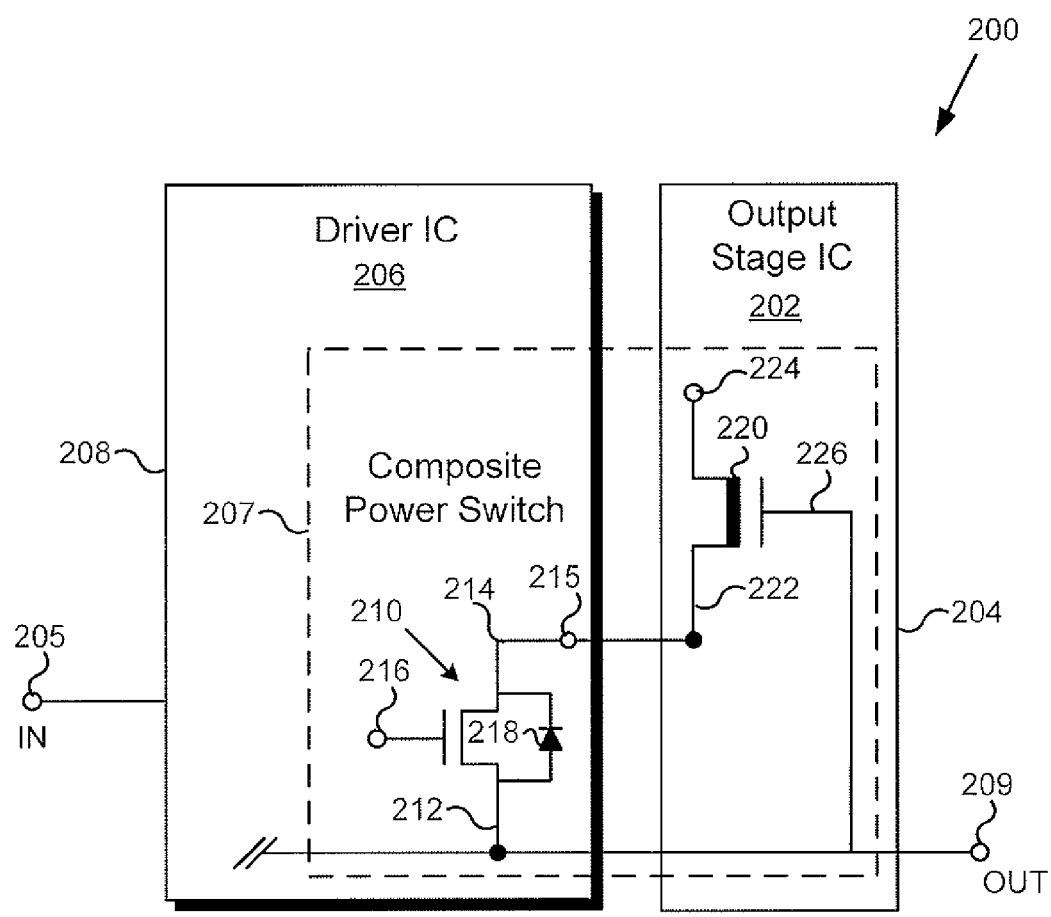
FIG. 2 shows a diagram of an exemplary power converter including a driver IC and an output stage IC having a depletion mode group III-V transistor.

Moving to FIG. 2, FIG. 2 shows a diagram of exemplary power converter 200 including output stage IC 202 in group III-V or output stage die 204, and driver IC 206 in group IV or driver IC die 208. As shown in FIG. 2, power converter 200 is configured to receive a signal corresponding to an input voltage at input 205 of driver IC 206, and to provide a converted voltage, e.g., a stepped down voltage, at output 209 of output stage IC 202. Power converter 200 corresponds in general to the circuitry included in package 101, in FIG. 1. That is to say, output stage IC 202 on group III-V or output stage die 204 and driver IC 206 on group IV or driver IC die 208, correspond respectively to output stage IC 102 on group III-V or output stage die 104 and driver IC 106 on group IV or driver IC die 108, in FIG. 1.

Output stage IC 202 is implemented using single depletion mode group III-V transistor 220 in the form of a depletion mode HEMT. Depletion mode group III-V transistor 220 includes source 222, drain 224, and gate 226. Depletion mode group III-V transistor 220 may be a mid-voltage (MV) or high voltage (HV) HEMT implemented as a GaN or other III-Nitride material based transistor, for example. Driver IC 206 includes group IV control switch 210 configured for use with depletion mode group III-V transistor 220. Group IV control switch 210 may be implemented as an LV group IV device, such as an LV silicon based MOSFET, for example. Group IV control switch 210 includes source 212, drain 214, and gate 216. Also shown in FIG. 2 is body diode 218 of group IV control switch 210.

As shown in FIG. 2, group IV control switch 210 is implemented in driver IC 206 using an open drain configuration wherein drain 214 of group IV control switch 210 provides input/output (I/O) node 215 of driver IC 206. As further shown in FIG. 2, group IV control switch 210 is cascoded with depletion mode group III-V transistor 220 to form composite power switch 207 split between group III-V or output stage die 204 and group IV or driver IC die 208. That is to say, depletion mode group III-V transistor 220 of composite power switch 207 is monolithically integrated in group III-V or output stage die 204, while group IV control switch 210 is monolithically integrated in group IV or driver IC die 208. Nevertheless, drain 214 of group IV control switch 210 is coupled to source 222 of depletion mode group III-V transistor 220 through I/O node 215, and gate 226 of depletion mode group III-V transistor 220 is coupled to source 212 of group IV control switch 210. It is noted that the dashed lines shown outside of composite power switch 207 and to the left of source 212 of group IV control switch 210 indicates that source 212 of group IV control switch 210 may be connected to additional circuitry of driver IC 206 not shown in FIG. 2.

The operation of depletion mode group III-V transistor 220 as an enhancement mode transistor by group IV control switch 210 will now be briefly described. When voltage is applied to drain 224 of depletion mode group III-V transistor 220 while depletion mode group III-V transistor 220 is ON, voltage will develop across reverse biased body diode 218 of group IV control switch 210. This voltage is inverted and applied to gate 226 of depletion mode group III-V transistor 220. Assuming that group IV control switch 210 and depletion mode group III-V transistor 220 are suitably selected such that group IV control switch 210 including body diode 218 can support a voltage in excess of a pinch-off voltage of depletion mode group III-V transistor 220, depletion mode group III-V transistor 220 will turn OFF and any additional increase in voltage at drain 224 will be sustained across drain 224 and source 222 of depletion mode group III-V transistor 220. Thereafter, depletion mode group III-V transistor 220 functions effectively as an enhancement mode transistor that can be selectively turned ON based on a gate voltage applied to gate 216 of group IV control switch 210.

Figure 3:
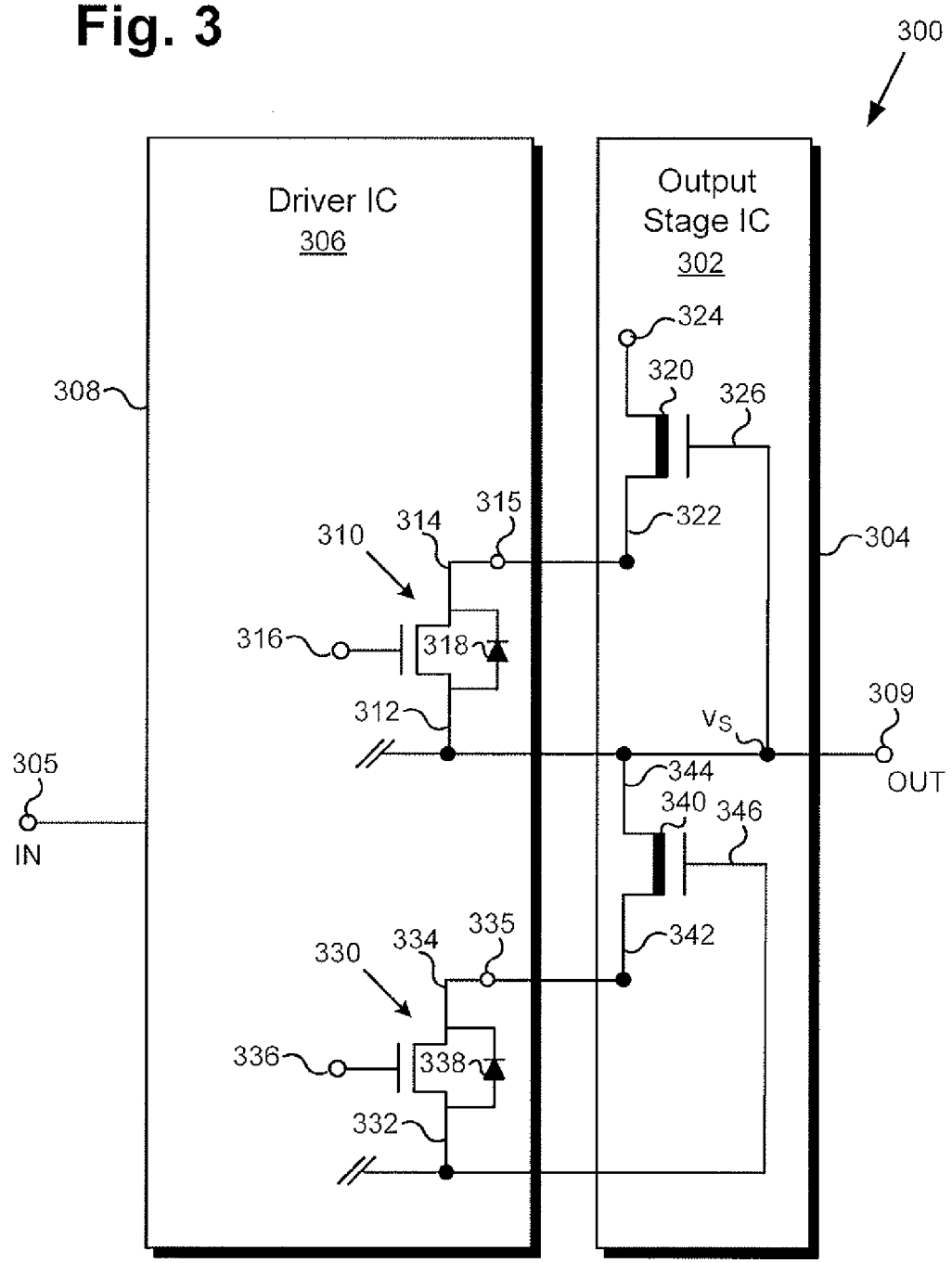
FIG. 3 shows a diagram of an exemplary power converter including a driver IC and an output stage IC having two monolithically integrated depletion mode group III-V transistors.

Referring now to FIG. 3, FIG. 3 shows a diagram of exemplary power converter 300 including output stage IC 302 and driver IC 306 for driving output stage IC 302. As shown in FIG. 3, power converter 300 is configured to receive a signal corresponding to an input voltage at input 305 of driver IC 306, and to provide a converted voltage, e.g., a stepped down voltage, at output 309 of output stage IC 302. Power converter 300 corresponds in general to the circuitry included in package 101, in FIG. 1. Power converter 300 corresponds in general to the circuitry included in package 101, in FIG. 1. That is to say, output stage IC 302 on group III-V or output stage die 304 and driver IC 306 on group IV or driver IC die 308, correspond respectively to output stage IC 102 on group III-V or output stage die 104 and driver IC 106 on group IV or driver IC die 108, in FIG. 1.

Output stage IC 302 is implemented using two depletion mode group III-V transistors 320 and 340 monolithically integrated in group III-V or output stage die 304. That is to say, output stage IC 302 includes high side depletion mode group III-V transistor 320 having source 322, drain, 324, and gate 326, as well as low side depletion mode group III-V transistor 340 having source 342, drain, 344, and gate 346. Respective high side and low side depletion mode group III-V transistors 320 and 340 may be MV or HV HEMTs implemented as GaN based devices, for example. The two depletion mode group III-V transistors 320 and 340 are driven by the two respective group IV control switches 310 and 330 monolithically integrated in group IV or driver IC die 308. Group IV control switches 310 and 330 may be implemented as silicon switches, such as LV silicon based MOSFETs, for example. Group IV control switch 310 includes source 312, drain 314, and gate 316, while group IV control switch 330 includes source 332, drain 334, and gate 336. Also shown in FIG. 3 are body diodes 318 and 338 of respective group IV control switches 310 and 330, and switch node $V_S$ of output stage IC 302.

As shown in FIG. 3, group IV control switches 310 and 330 are implemented in driver IC 306 using an open drain configuration wherein drains 314 and 334 of respective group IV control switches 310 and 330 provide respective I/O nodes 315 and 335 of driver IC 306. As further shown in FIG. 3, group IV control switch 310 is cascoded with high side depletion mode group III-V transistor 320 to form a high side composite power switch, and group IV control switch 330 is cascaded with low side depletion mode group III-V transistor 340 to form a low side composite power switch. That is to say, drain 314 of group IV control switch 310 is coupled to source 322 of high side depletion mode group III-V transistor 320 through I/O node 315, and gate 326 of high side depletion mode group III-V transistor 320 is coupled to source 312 of group IV control switch 310. In addition, drain 334 of group IV control switch 330 is coupled to source 342 of low side depletion mode group III-V transistor 340 through I/O node 335, and gate 346 of low side depletion mode group III-V transistor 340 is coupled to source 332 of group IV control switch 330. It is noted that the dashed lines shown to the left of sources 312 and 332 of respective group IV control switches 310 and 330 indicate that sources 312 and 332 of respective group IV control switches 310 and 330 may be connected to additional circuitry of driver IC 306 not shown in FIG. 3.

The operation of high side and low side depletion mode group III-V transistors 320 and 340 as enhancement mode transistors is analogous to that described above by reference to the implementation shown in FIG. 2 and will not be further described here. Suffice it to say that as a result of the implementation shown in FIG. 3, high side and low side depletion mode group III-V transistors 320 and 340 function effectively as enhancement mode transistors that can be selectively turned ON based on a gate voltage applied, respectively, to gates 316 and 336 of respective group IV control switches 310 and 330.

Figure 4:
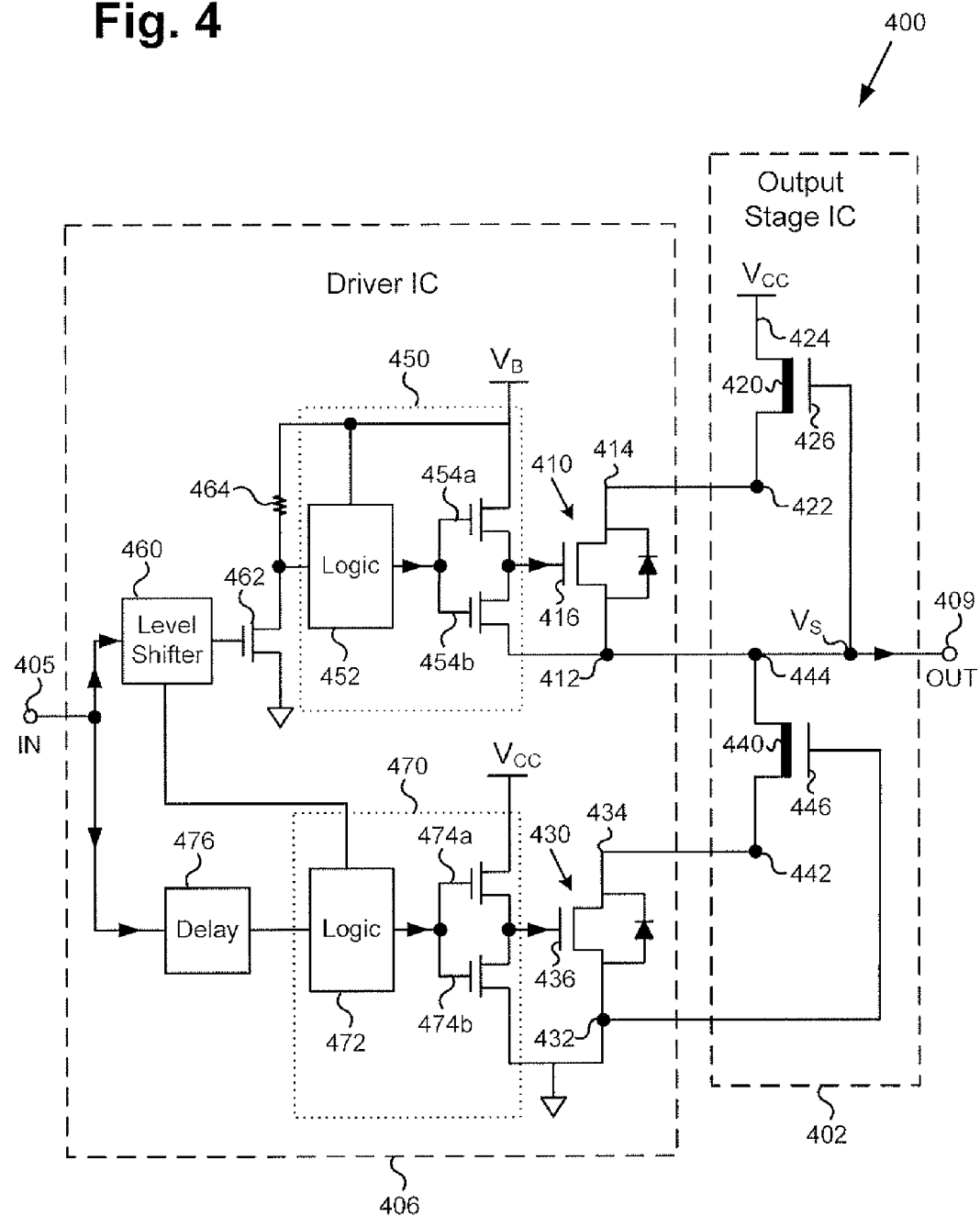
FIG. 4 shows a power converter circuit diagram corresponding to the exemplary power converter shown in FIG. 3, according to one implementation.

Moving to FIG. 4, FIG. 4 shows power converter circuit diagram 400 corresponding to exemplary power converter 300, in FIG. 3. Power converter circuit diagram 400 includes output stage IC 402 with monolithically integrated high side and low side depletion mode group III-V transistors 420 and 440. Power converter circuit diagram 400 also includes driver IC 406 having monolithically integrated group IV control switches 410 and 430 for driving respective high side and low side depletion mode group III-V transistors 420 and 440. As shown in FIG. 4, the power converter represented by power converter circuit diagram 400 is configured to receive a signal corresponding to an input voltage at input 405 of driver IC 406, and to provide a converted voltage, e.g., a stepped down voltage, at output 409 of output stage IC 402.

Power converter circuit diagram 400 corresponds in general to the circuitry included in package 101, in FIG. 1. Moreover, output stage IC 402 and driver IC 406, in FIG. 4, correspond respectively to output stage IC 102 and driver IC 106, in FIG. 1. In addition, output stage IC 402 including monolithically integrated high side and low side depletion mode group III-V transistors 420 and 440, and driver IC 406 including monolithically integrated group IV control switches 410 and 430, in FIG. 4, correspond respectively to output stage IC 302 including monolithically integrated high side and low side depletion mode group III-V transistors 320 and 340, and driver IC 306 including monolithically integrated group IV control switches 310 and 330, in FIG. 3.

As shown in FIG. 4, in addition to group IV control switches 410 and 430, driver IC 406 includes high side driver 450 and low side driver 470. High side driver 450 includes logic block 452 and driver transistors 454a and 454b coupled in series as a half bridge between high voltage rail $V_B$ and the voltage at switch node $V_S$. High side driver 450 is coupled to input 405 of driver IC 406 by a level shift arrangement including level shifter block 460, level shift transistor 462, and resistor 464. Low side driver 470 includes logic block 472 and driver transistors 474a and 474b coupled in series as a half bridge between voltage rail $V_{CC}$ and ground. Low side driver 470 is coupled to input 405 of driver IC 406 by delay block 476.

Level shifter block 460, level shift transistor 462, resistor 464, and high side driver 450 are configured to provide gate signals to group IV control switch 410, while delay block 476 and low side driver 470 are configured to provide gate signals to group IV control switch 430. Moreover, and as explained above, group IV control switches 410 and 430 can be utilized to maintain respective high side and low side depletion mode group III-V transistors 420 and 440 in an OFF state until being selectively turned ON by respective group IV control switches 410 and 430. In other words, high side and low side group depletion mode group III-V transistors 420 and 440 are driven by respective group IV control switches 410 and 430. As a result, the implementation of IC driver 406 shown in FIG. 4 can be used to operate high side and low side depletion mode group III-V transistors 420 and 440 of output stage IC 402 as though they are normally OFF, enhancement mode, transistors.

It is noted that because group IV control switches 410 and 430 are integrated with driver IC 406, i.e., monolithically integrated in the group IV die providing driver IC 406, high side and low side depletion mode group III-V transistors 420 and 440 are structurally independent of group IV control switches 410 and 430 with which they are cascoded. As a result, the present solution enables implementation of output stage IC 402 using a monolithically integrated approach in which high side and low side depletion mode group III-V transistors 420 and 440 are fabricated on a common group III-V or output stage die. For example, the lateral configurations adopted in many III-Nitride HEMT topologies lend themselves to such monolithic integration. Consequently, power converter circuit diagram 400 can be physically implemented using as few as two semiconductor dies, a group IV or driver IC die having fabricated thereon driver IC 406 including group IV control switches 410 and 430, and a group III-V or output stage die having fabricated thereon high side and low side depletion mode group III-V transistors 420 and 440. By contrast the conventional hybrid assembly approach would typically require five semiconductor dies: one for a driver IC, one for each of group IV control switches implemented independently of the driver IC, and one for each depletion mode group III-V transistor.

Thus, the present application discloses a power converter including a driver IC designed for use with one or more depletion mode group III-V transistors. In one implementation, a group IV control switch is used in combination with a depletion mode group III-V transistor to provide a composite power switch having enhancement mode functionality. By monolithically integrating the group IV control switch into the driver IC die, the present inventive concepts enable use of low voltage IC technology for fabrication of the group IV control switch, resulting in a very low $R_{DS\_ON}$ figure of merit for the group IV control switch output. In addition, by enclosing the driver IC and one or more depletion mode group III-V transistors monolithically integrated in a separate output stage die in a package using a substantially no-leads package design, implementations of the present solution advantageously reduce parasitic inductances and capacitances. Moreover, by utilizing only two discrete semiconductor dies to enable enhancement mode functionality by multiples depletion mode group III-V transistors, the present solution further reduces parasitic inductances and capacitances, while concurrently substantially minimizing package size. Consequently, the present application discloses a solution capable of enhancing power conversion performance across a wide variety of applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A power converter comprising:
    an output stage integrated circuit (IC) on a group III-V die,
    a driver IC for driving said output stage IC, said driver IC fabricated on a group IV die;
    a composite power switch split between said group III-V die and said group IV die, wherein a depletion mode group III-V transistor of said composite power switch is monolithically integrated in said group III-V die, and a group IV control switch of said composite power switch is monolithically integrated in said group IV die;
    said depletion mode group III-V transistor being operated as an enhancement mode transistor.

2. The power converter of claim 1, wherein said group III-V die comprises a III-Nitride die.

3. The power converter of claim 1, wherein said group IV die comprises a silicon die.

4. The power converter of claim 1, wherein said group IV control switch is a low voltage (LV) switch.

5. The power converter of claim 1, wherein said group IV control switch comprises a silicon field-effect transistor (FET).

6. The power converter of claim 1, wherein said depletion mode group III-V transistor comprises a depletion mode III-Nitride FET.

7. The power converter of claim 1, wherein said depletion mode group III-V transistor is selected from the group consisting of a midvoltage (MV) transistor and a high voltage (HV) transistor.

8. The power converter of claim 1, wherein said depletion mode group III-V transistor comprises a III-Nitride high electron mobility transistor (HEMT).

9. The power converter of claim 1, wherein said power converter is a buck converter.

10. The power converter of claim 1, wherein said power converter is enclosed in a package configured to contain only two semiconductor dies.

11. A power converter comprising:
    two depletion mode GaN transistors monolithically integrated in an output stage die;
    said two depletion mode GaN transistors being driven by two silicon control switches monolithically integrated in a driver IC die;
    said two depletion mode GaN transistors being operated as enhancement mode transistors.

12. The power converter of claim 11, wherein said output stage die comprises a III-Nitride die.

13. The power converter of claim 11, wherein said driver IC die comprises a group IV die.

14. The power converter of claim 11, wherein said driver IC die comprises a silicon die.

15. The power converter of claim 11, wherein said two silicon control switches are low voltage (LV) switches.

16. The power converter of claim 11, wherein said two silicon control switches comprise silicon field-effect transistors (FETs).

17. The power converter of claim 11, wherein said two depletion mode GaN transistors are selected from the group consisting of midvoltage (MV) transistors and high voltage (HV) transistors.

18. The power converter of claim 11, wherein said two depletion mode GaN transistors comprise GaN high electron mobility transistors (HEMTS).

19. The power converter of claim 11, wherein said power converter is a buck converter.

20. The power converter of claim 11, wherein said power converter is enclosed in a package configured to contain only two semiconductor dies.

* * * * *